(12) United States Patent
Brand et al.

(10) Patent No.: US 9,190,498 B2
(45) Date of Patent: Nov. 17, 2015

(54) TECHNIQUE FOR FORMING A FINFET DEVICE USING SELECTIVE ION IMPLANTATION

(71) Applicant: Varian Semiconductor Equipment Associates, Inc., Gloucester, MA (US)

(72) Inventors: Adam Brand, Palo Alto, CA (US); Srinivas Nemani, Sunnyvale, CA (US); John J. Hautala, Beverly, MA (US); Ludovic Godet, Boston, MA (US); Yuri Erokhin, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 82 days.

(21) Appl. No.: 14/026,218

(22) Filed: Sep. 13, 2013

(65) Prior Publication Data

US 2014/0080276 A1    Mar. 20, 2014

Related U.S. Application Data

(60) Provisional application No. 61/701,342, filed on Sep. 14, 2012.

(51) Int. Cl.
*H01L 29/66* (2006.01)
*H01L 21/02* (2006.01)
*H01L 21/311* (2006.01)
*H01L 21/3115* (2006.01)

(52) U.S. Cl.
CPC .... *H01L 29/66803* (2013.01); *H01L 21/02321* (2013.01); *H01L 21/31133* (2013.01); *H01L 21/31138* (2013.01); *H01L 21/31155* (2013.01)

(58) Field of Classification Search
None
See application file for complete search history.

(56) References Cited

U.S. PATENT DOCUMENTS

| 6,207,517 B1 * | 3/2001 | Muller | 438/301 |
| 2011/0021027 A1 * | 1/2011 | Johnson | 438/694 |
| 2013/0280883 A1 * | 10/2013 | Faul et al. | 438/434 |

* cited by examiner

*Primary Examiner* — Charles Garber
*Assistant Examiner* — Brigitte Paterson

(57) ABSTRACT

A three-dimensional structure disposed on a substrate is processed so as to alter the etch rate of material disposed on at least one surface of the structure. In some embodiments, a conformal deposition of material is performed on the three-dimensional structure. Subsequently, an ion implant is performed on at least one surface of the three-dimensional structure. This ion implant serves to alter the etch rate of the material deposited on that structure. In some embodiments, the ion implant increases the etch rate of the material. In other embodiments, the ion implant decreases the etch rate. In some embodiments, ion implants are performed on more than one surface, such that the material on at least one surface is etched more quickly and material on at least one other surface is etched more slowly.

7 Claims, 10 Drawing Sheets

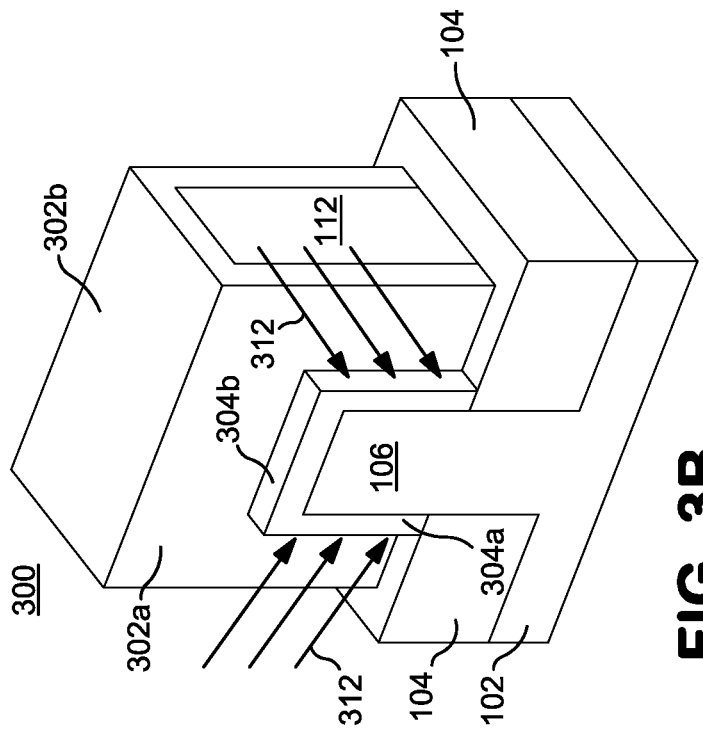
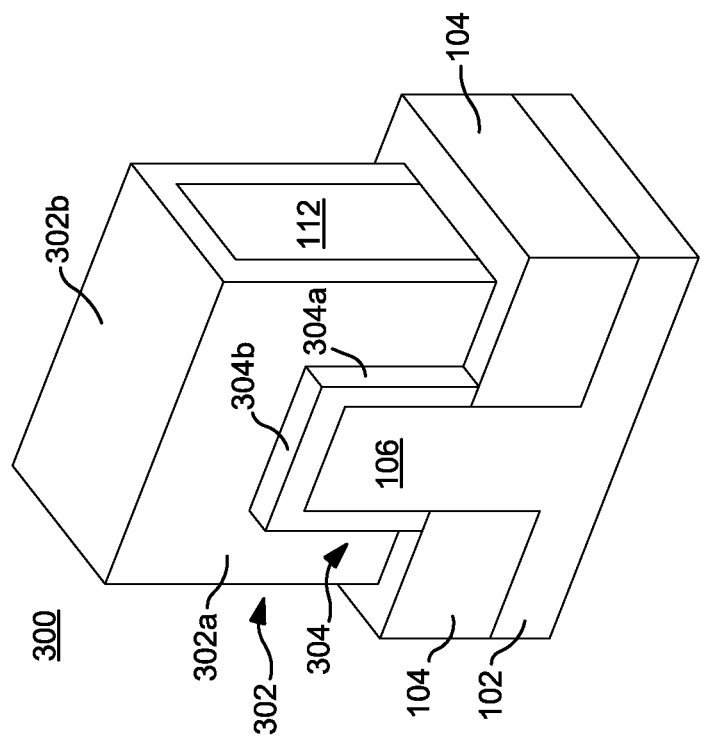
FIG. 3B
FIG. 3A

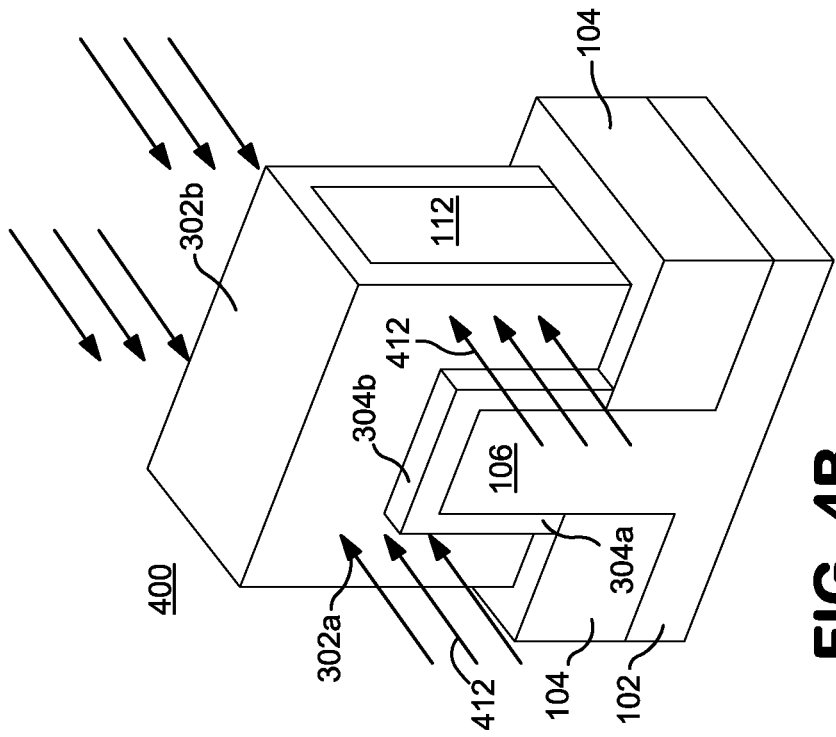
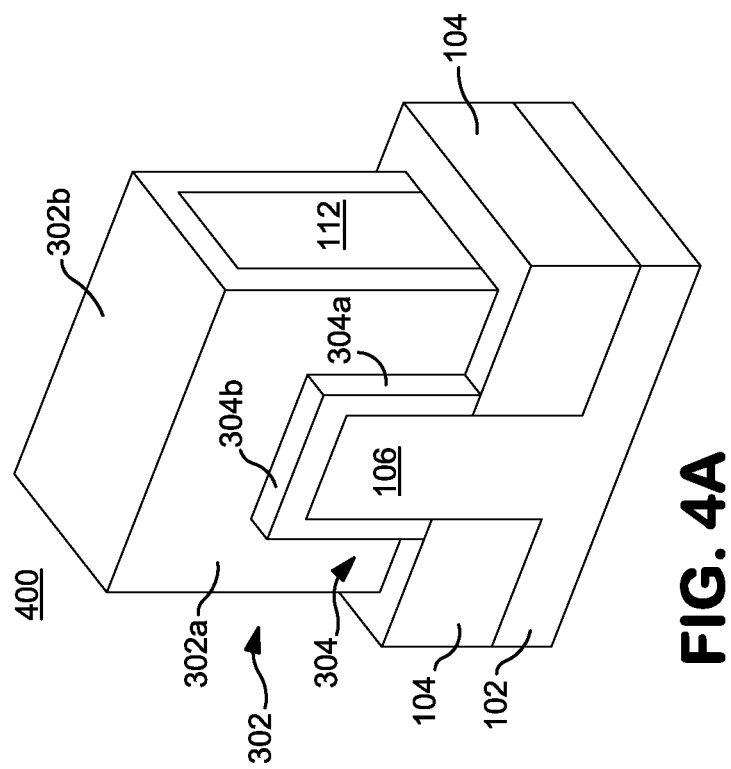
FIG. 4B
FIG. 4A

TECHNIQUE FOR FORMING A FINFET DEVICE USING SELECTIVE ION IMPLANTATION

This application claims priority of U.S. Provisional Patent Application Ser. No. 61/701,342, filed Sep. 14, 2012, the disclosure of which is incorporated herein by reference in its entirety.

FIELD OF THE DISCLOSURE

The present disclosure relates to a method for processing a three-dimensional substrate, more particularly for a method for processing a FinFET device.

BACKGROUND

In response to an increased need for smaller electronic devices with denser circuits, devices with three-dimensional (3D) structures have been developed. An example of such devices includes FinFET devices having conductive fin-like structures that are raised vertically above the horizontally extending substrate. Referring to FIG. 1, there is shown a perspective view of a conventional FinFET device 100 formed on a substrate 102. The substrate 102 may comprise, for example, a silicon substrate. On the substrate 102, there may be an oxide layer 104. This oxide layer 104 may be, for example, silicon oxide. FinFET device 100 may also comprise a fin structure 106 which may serve as a source, drain, and a channel. The conventional FinFET device 100 may also include a gate 112 formed across the fin structure 106, and a gate dielectric 108 that electrically isolates the gate 112 from the fin structure 106. In the conventional FinFET device 100, the surface area of the fin structure 106 in contact with gate dielectric 108 may be the effective channel region.

Much like other conventional MOS devices, FinFET device 100 also comprises spacers 122 disposed on selected regions of the FinFET device 100. Generally, the spacers 122 are dielectric materials formed on the vertical side surfaces of the gate 112, as illustrated in FIG. 2. These are formed by depositing a dielectric material, such as, for example, silicon nitride, on gate 112 and the fin structure 106 and selectively removing material from the fin structure 106. In particular, the dielectric material is deposited on the side surfaces 112a and top surface 112b of the gate 112, and on the side surfaces 106a and top surface 106b of the fin structure 106. Thereafter, the dielectric material is removed from the side surfaces 106a and top surface 106b of the fin structure 106. The dielectric material may also be removed from the top surface 112b of the gate 112, thereby leaving dielectric material only on the side surfaces 112a of the gate 112a.

If improperly formed, the spacers 122 may adversely affect the performance of the FinFET device 100. In the conventional method, the dielectric material may be overetched, and the resulting spacers 122 may provide inadequate coverage of the side surfaces 112a of the gate 112. In addition, the spacer residue 124 may be left on the side surfaces 106a of the fin structure 106. The spacers 122 with inadequate coverage, or spacer residue 124 near the fin structure 106 may detrimentally affect the performance of the FinFET device 100. To compensate, the gate 112 is formed much taller than the fin structure 106, and the fin structure 106 is formed tapered to enhance removal of the dielectric material from the fin structure 106. This results in a tapered fin structure 106 which degrades short channel effects. It also results in some non-uniformity of the spacer width due to overetch. Accordingly, a new method for forming FinFET device is needed.

SUMMARY

A three-dimensional structure disposed on a substrate is processed so as to alter the etch rate of material disposed on at least one surface of the structure. In some embodiments, a conformal deposition of material is performed on the three-dimensional structure. Subsequently, an ion implant is performed on at least one surface of the three-dimensional structure. This ion implant serves to alter the etch rate of the material deposited on that structure. In some embodiments, the ion implant increases the etch rate of the material. In other embodiments, the ion implant decreases the etch rate. In some embodiments, ion implants are performed on more than one surface, such that the material on at least one surface is etched more quickly and material on at least one other surface is etched more slowly.

According to one embodiment, a method of processing a three-dimensional structure, having a plurality of surfaces, disposed on a substrate, is disclosed. The method comprises implanting a first species of ions into at least a first surface of the three-dimensional structure, where the first species of ions alters an etch rate of material disposed on the first surface; and performing an etching process on the three-dimensional structure after the implanting to remove the material from at least one surface of the three-dimensional structure. In a further embodiment, the method further comprises depositing the material on the three-dimensional structure prior to the implanting.

According to a second embodiment, a method of forming spacers on side surfaces of a gate on a finFET, where the finFET comprises a fin structure and the gate is disposed on the fin structure, is disclosed. The method comprises depositing a dielectric material on the finFET, wherein the dielectric material covers a top surface and side surfaces of the gate and covers a top surface and side surfaces of the fin structure; implanting ions of a first species into the dielectric material disposed on the side surfaces of the fin structure, the first species increasing an etch rate of the material; and performing an etching process on the finFET after the implanting so that the dielectric material remains on the side surfaces of the gate.

According to a third embodiment, a method of forming spacers on side surfaces of a gate on a finFET, where the finFET comprises a fin structure and the gate is disposed on the fin structure, is disclosed. The method comprises depositing a dielectric material on the finFET, wherein the dielectric material covers a top surface and side surfaces of the gate and covers a top surface and side surfaces of the fin structure; implanting ions into the dielectric material disposed on the side surfaces of said gate, the ions decreasing an etch rate of the material; performing an etching process on the finFET after the implanting so that the dielectric material remains on the side surfaces of the gate.

BRIEF DESCRIPTION OF THE DRAWINGS

For a better understanding of the present disclosure, reference is made to the accompanying drawings, which are incorporated herein by reference and in which:

FIGS. 3A-3C show a method of forming spacers on a FinFET according to a first embodiment;

FIGS. 4A-4C show a method of forming spacers on a FinFET according to a second embodiment;

DETAILED DESCRIPTION

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Figure 2:
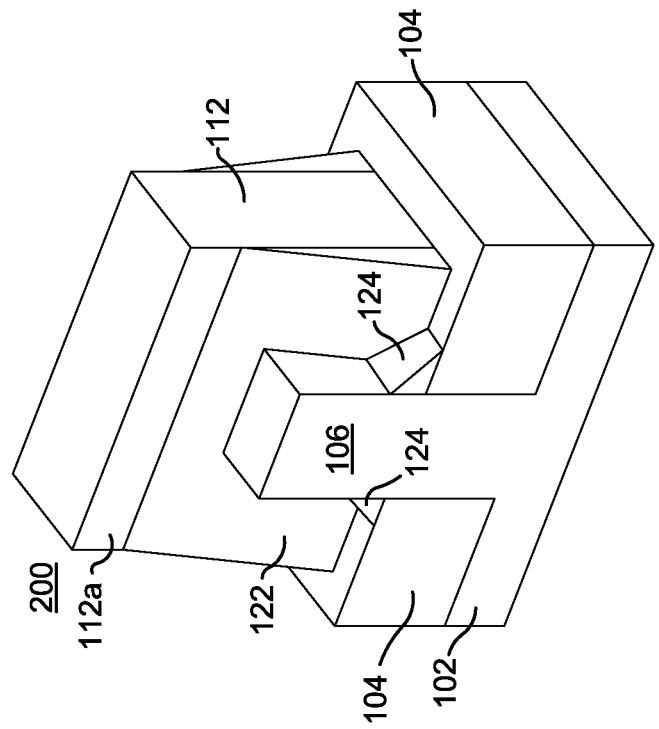
FIG. 2 is a perspective view of the FinFET of FIG. 1 with overetched spacers.
Figure 1:
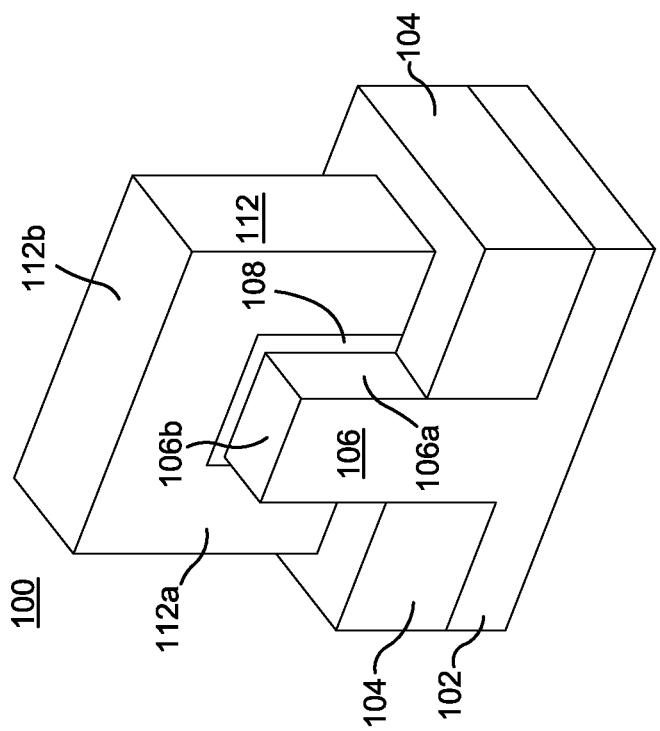
FIG. 1 is a perspective view of a conventional FinFET device according to the prior art.
Figure 3C:
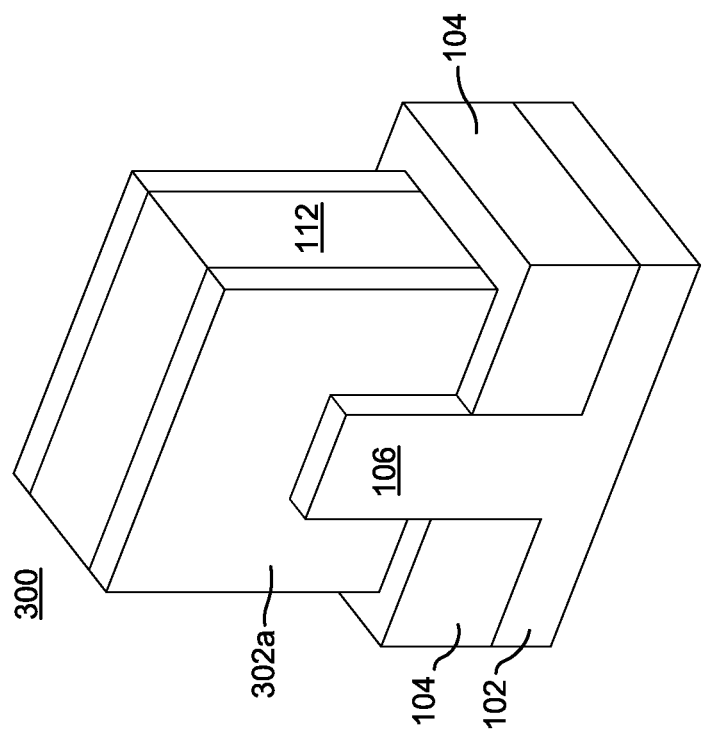

Referring to FIG. 3A-3C, there is shown a method of forming spacers in FinFET device 300 according to one embodiment of the present disclosure. Those of ordinary skill in the art will recognize that many of the FinFET components illustrated in FIGS. 1 and 2 are also included in the FinFET components shown in FIG. 3. As such, the description of the present embodiment should be read in relation to FinFET devices shown in FIGS. 1 and 2.

As illustrated in FIG. 3A, the FinFET device 300 comprises a fin structure 106 extending from the substrate 102, an oxide layer 104, and a gate 112. Although not shown in FIG. 3A-3C, the FinFET device 300 also includes a gate dielectric that electrically isolates the gate 112 from the fin structure 106, as illustrated in FIG. 1.

To form the spacers 302, dielectric material is conformally deposited on the gate 112 and the fin structure 106. A conformal deposition is defined as a deposition where a thickness of material is uniformly applied to all of the exposed surfaces. As illustrated in FIG. 3A, the dielectric material is deposited on the side surfaces and top surface of the gate 112. This forms a side portion of dielectric material 302a and a top portion of dielectric material 302b, respectively. In addition, the dielectric material is deposited on the side surfaces and top surface of fin structure 106. This forms a side portion of dielectric material 304a and a top portion of dielectric material 304b, respectively. Although not shown for clarity purposes, the dielectric material may also be deposited on the exposed top surface of oxide layer 104. In the present disclosure, the dielectric material may be one of silicon nitride; silicon carbide; silicon oxide; boron nitride; and/or aluminum oxide. In addition, the dielectric material may be doped (e.g. with C) or undoped.

Thereafter, a portion of the dielectric material may be selectively processed as shown in FIG. 3B. In the present embodiment, the side portion of the dielectric material 304a formed on the side surfaces of fin structure 106 may be selectively processed to alter the etch rate. For example, the side portion of the dielectric material 304a may be implanted with ions 312 capable of increasing the etch rate. Examples of the species of such ions may include Ar, C, Si, F, H, He, and O, among others. Those of ordinary skill in the art will recognize that other species may also be used. In the present disclosure, a beam-line ion implantation system may be used to implant the etch rate increasing ions 312 into the side portion of the dielectric material 304a. In the present embodiment, one side portion of the dielectric material 304a may be implanted with ions 312, and the FinFET device 300 may be rotated 180 degrees to implant the side portion of the dielectric material 304a on the other side surface of the fin structure 106. Preferably, an implantation at an angle compatible with the feature pitch of the fin structure 106 may be performed. The orientation provides a treatment of the fin structure without implanting the gate structure because they are orthogonal.

After the selective processing of the dielectric material 304a disposed on the fin structure 106, an anisotropic or atomic layer etching process may be used to remove the dielectric material 302b formed on the top surface of the gate 112, the dielectric material 304b on the top surface of the fin structure 106, and the dielectric material 304a on the side surface of the fin structure 106. An anisotropic etch is one that preferentially etches material in one direction or plane. For example, an anisotropic etch may preferentially etch the horizontal surfaces of dielectric material 302b, 304b. The resulting structure, as shown in FIG. 3C, comprises dielectric spacers 302a formed on the side surfaces of the gate 112 of the FinFET device 300.

In another embodiment, ions 312 may be implanted into additional surfaces. For example, ions 312 that increase the etch rate may be implanted into the top portion of dielectric material 304b disposed on the top surface of the fin structure 106. Additionally, ions 312 that increase the etch rate may be deposited into the top portion of dielectric material 302b disposed on the top surface of gate 112. Following the implanting of ions, an isotropic etch may be performed, which etches in all directions equally. Since the etch rates of the dielectric material 302b disposed on top surface of the gate 112 and the dielectric material 304 disposed on the fin structure 106 have been increased by implanted ions 412, these materials may be removed first. The dielectric material 302a on the side surfaces of the gate 112 remains after the isotropic etch.

In a different embodiment, a ribbon ion beam with a controllable angle distribution may be used. In this embodiment, the substrate can be scanned once with the fin structure 106 aligned to the length of the ribbon beam. This alignment allows processing of both side surfaces and the top surface of fin structure 106 and the top surface of the gate 112 at the same time with a species that enhances the etch selectivity of the dielectric material film on the fin structure 106 as compared to that of the spacer layer on the side surfaces of the gate 112.

In the present disclosure, a mask may optionally be used to control the implantation process. For example, mask may be disposed on top portion of the dielectric material 304b disposed on the fin structure 106 to improve selective implantation. For example, it may be advantageous to slow the etch rate of the dielectric material 304b to prevent damage to the fin structure 106.

An advantage of this method is that it enhances removal of the side portion of dielectric material 304a disposed on the vertical side surface 106a of the fin structure 106.

Figure 4C:
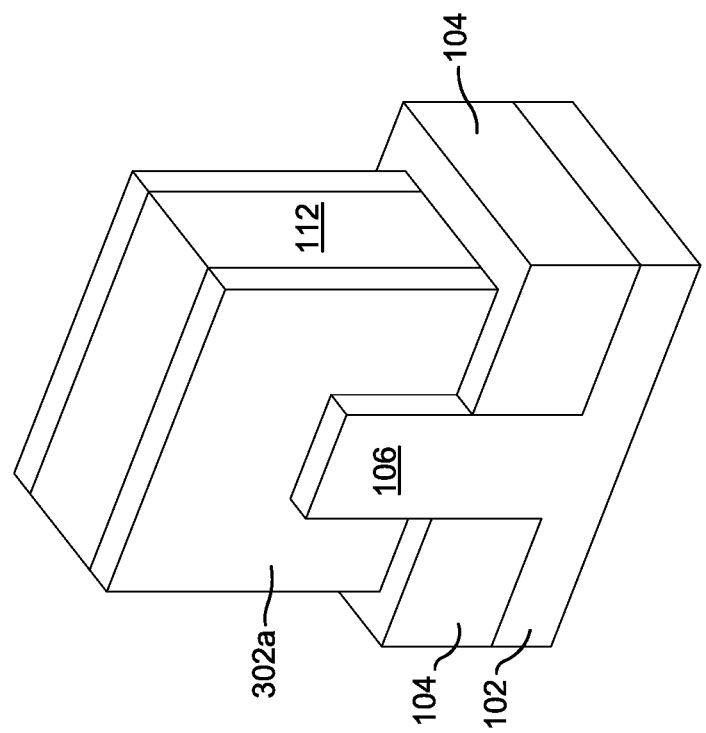

Referring to FIG. 4A-4C, there is shown another method of forming spacers in FinFET device 400 according to another embodiment of the present disclosure. Those of ordinary skill in the art will recognize that many of the FinFET components illustrated in FIG. 1-3 are also included in the FinFET components shown in FIG. 4A-4C. As such, the description of the present embodiment should be read in relation to FinFET devices shown in FIG. 1-3.

As illustrated in FIG. 4A, the FinFET device 300 comprises a fin structure 106 extending from the substrate 102, an oxide layer 104, and a gate 112. Although not shown in FIG. 4A-4C, the FinFET device 300 also includes a gate dielectric that electrically isolates the gate 112 from the fin structure 106, as illustrated in FIG. 1.

To form the spacers 302, dielectric material is conformally deposited on the gate 112 and the fin structure 106. Although not shown for clarity purposes, the dielectric material may also be deposited on the exposed top surface of oxide layer 104. As illustrated in FIG. 4A, the dielectric material is deposited on the side surfaces and top surface of the gate 112. This forms a side portion of dielectric material 302a and a top portion of dielectric material 302b, respectively. In addition, the dielectric material is deposited on the side surfaces and top surface of fin structure 106. This forms a side portion of dielectric material 304a and a top portion of dielectric material 304b, respectively. Although not shown for purposes of clarity, the dielectric material may also be deposited on the exposed top surface of oxide layer 104. In the present disclosure, the dielectric material may be one of silicon nitride; silicon carbide; silicon oxide; boron nitride; and/or aluminum oxide. In addition, the dielectric material may be doped (e.g. with C) or undoped.

Thereafter, a portion of the dielectric material may be selectively processed as shown in FIG. 4B. In the present embodiment, a portion of the dielectric material formed on the side surface of the gate 112 is processed to alter the etch rate. For example, the side portion of the dielectric material 302a may be implanted with ions 412 capable of increasing the etch resistance (i.e. decreasing the etch rate). Examples of the species of such ions may include C, P, B. Those of ordinary skill in the art will recognize that other species may also be used. In the present disclosure, a beam-line ion implantation system may be used to implant the etch rate decreasing ions 412 into the side portion of the dielectric material 302a formed on the side surfaces of the gate 112. In the present embodiment, one side portion of the dielectric material 302a formed on the side surface of the gate 112 may be implanted with ions 412, and the FinFET device 300 may be rotated 180 degrees to implant the other side portion of the dielectric material 302a formed on the second side surface of the gate 112.

After the selective processing of the dielectric material 302a disposed on the side surface of the gate 112, an anisotropic or atomic layer etching process may be used to remove the dielectric material 302b formed on the top surface of the gate 112, the dielectric material 304b on the top surface of the fin structure 106, and the dielectric material 304a on the side surface of the fin structure 106. In other embodiments, an isotropic etch may be performed. Since the etch rate of dielectric material 302a disposed on side surfaces of the gate 112 has been decreased by ions 412, the dielectric material 302a will remain on this surface after the isotropic etch. The resulting structure, as shown in FIG. 4C, comprises dielectric spacers 302a formed on the side surface of the gate 112 of the FinFET device 300.

Referring to FIG. 5A-5D, there is shown another method of forming spacers in FinFET device 500 according to another embodiment of the present disclosure. Those of ordinary skill in the art will recognize that many of the FinFET components illustrated in FIG. 1-4 are also included in the FinFET components shown in FIG. 5A-5D. As such, the description of the present embodiment should be read in relation to FinFET devices shown in FIG. 1-4.

Figure 5B:
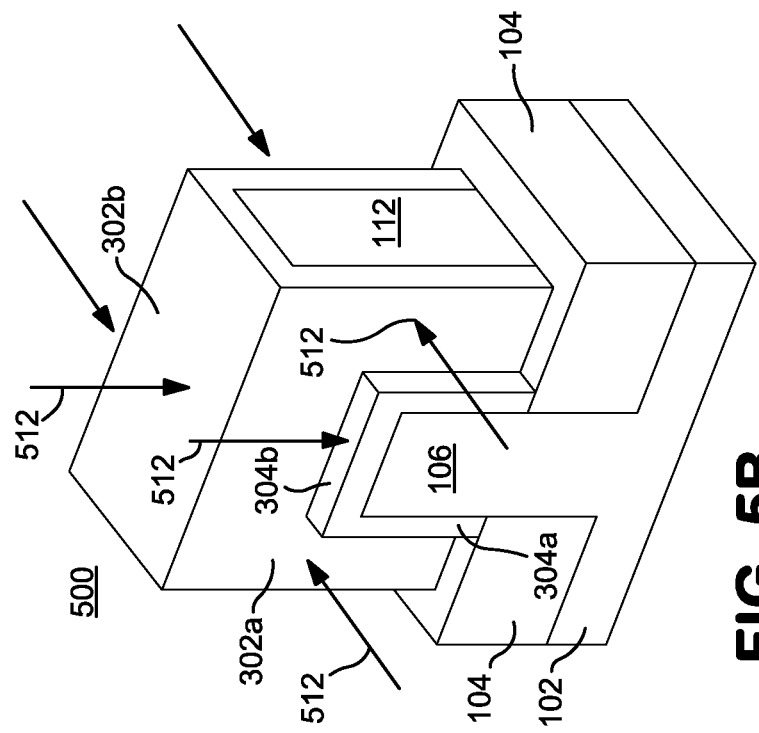
FIGS. 5A-5D show a method of forming spacers on a FinFET according to a third embodiment.
Figure 5A:
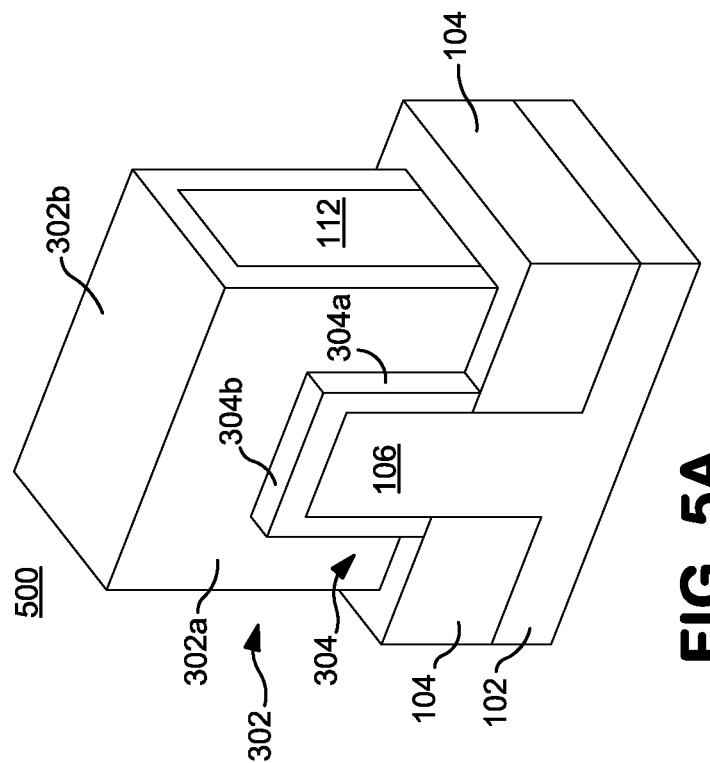

As illustrated in FIG. 5A, the FinFET device 300 comprises a fin structure 106 extending from the substrate 102, an oxide layer 104, and a gate 112. Although not shown in FIG. 3A-3C, the FinFET device 300 also includes a gate dielectric that electrically isolates the gate 112 from the fin structure 106, as shown in FIG. 1.

To form the spacers 302, dielectric material is conformally deposited on the gate 112 and the fin structure 106. Although not shown for clarity purposes, the dielectric material may also be deposited on the exposed top surface of oxide layer 104. As illustrated in FIG. 5A, the dielectric material is deposited on the side surfaces and top surface of the gate 112. This forms a side portion of dielectric material 302a and a top portion of dielectric material 302b, respectively. In addition, the dielectric material is deposited on the side surfaces and top surface of fin structure 106. This forms a side portion of dielectric material 304a and a top portion of dielectric material 304b, respectively. Although not shown for purposes of clarity, the dielectric material may also be deposited on the exposed top surface of oxide layer 104. In the present disclosure, the dielectric material may be one of silicon nitride; silicon carbide; silicon oxide; boron nitride; and/or aluminum oxide. In addition, the dielectric material may be doped (e.g. with C) or undoped.

Figure 5C:
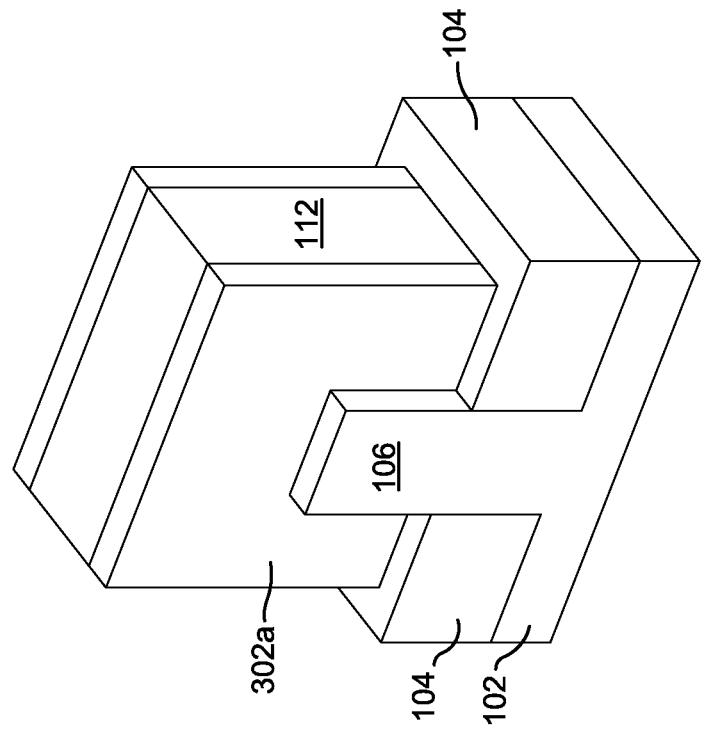

Thereafter, a portion of the dielectric material may be selectively processed to enhance etch selectivity, as shown in FIGS. 5B and 5C. First, as shown in FIG. 5B, ions capable of increasing the etch resistivity 512 are implanted into the side portion of the dielectric material 302a formed on the side surface of the gate 112. In addition, the ions capable of increasing the etch resistivity 512 are implanted to the top portion of the dielectric material 304b formed on the fin structure 106 and the top portion of the dielectric material 302b formed on the gate 112. Although the top portions of dielectric material 304b, 302b are intended to be etched, implanting ions 512 into this material may slow the etch rate. This may be beneficial as the top surfaces of the fin structure 106 and the gate 112 may be more susceptible to the fast etch rate of the anisotropic etch. Thus, the implanting of ions 512 into dielectric material 304b, 302b allows for some tuning of the vertical and horizontal etch rates of the different surfaces. In other embodiments, ions 512 are only implanted into the side portion of the dielectric material 302a formed on the side surface of the gate 112. As noted above, several examples of the species of such ions 512 may include C, P, B.

Although not shown, ions 512 may also be implanted into the dielectric material that coats the exposed top surface of the oxide layer 104.

After implanting the dielectric material with the ions 512 that are capable of increasing the etch resistivity (i.e. decreasing the etch rate), selected portions of the dielectric material are implanted with the ions 514 that are capable of increasing the etch rate. Examples of the species of such ions 514 may include Ar, C, Si, F, H, He, and O, among others. As shown in FIG. 5C, the top portion of the dielectric material 302b disposed on the gate 112 is implanted with the ions 514 that are capable of increasing the etch rate. In addition, the side portion 304a of the dielectric material formed on the side surface of the fin structure 106 may be implanted with ions 514. In addition, the top portion 304b of the dielectric material formed on the top surface of the fin structure 106 may be implanted with ions 514. Between implanting with the ions 512 that are capable of increasing the etch resistivity and the ions 514 that are capable of increasing etch rate, the FinFET device 500, in some embodiments, may be rotated 90 degrees.

Figure 5D:
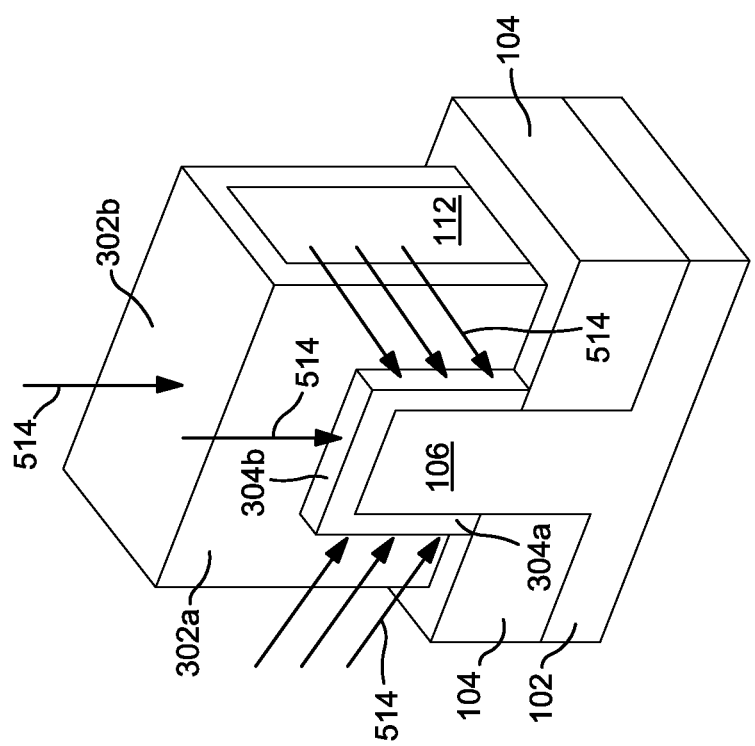

After the selective processing of the dielectric material disposed on the fin structure 106, an anisotropic or atomic layer etching process may be used to remove the dielectric material formed on the top surface of the gate 112, on the top surface of the fin structure 106, and on the side surfaces of the fin structure 106. The resulting structure, as shown in FIG. 5D, comprises dielectric spacers 302a formed on the side surfaces of the gate 112 of the FinFET device 300. In another embodiment, an isotropic etch may be performed to remove the dielectric material from these surfaces.

While the above description is directed toward a finFET, the disclosure is not limited to this embodiment. Rather, the methods shown in the figures can be adapted to process any three-dimensional structure.

Figure 6:
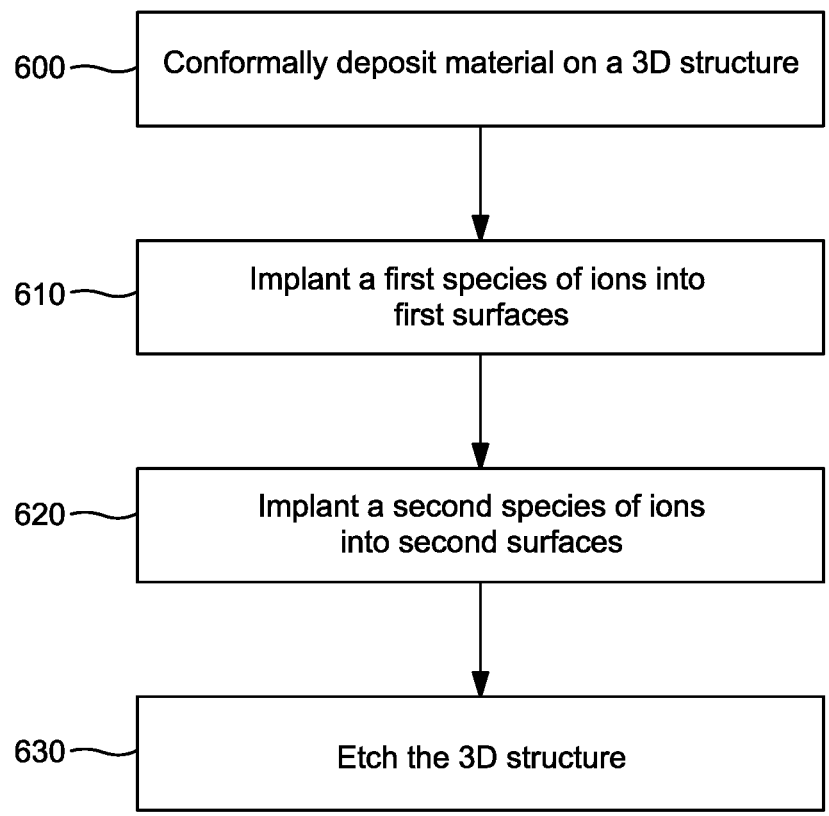
FIG. 6 is a flowchart showing the processing of a three-dimensional structure on a substrate.

FIG. 6 shows a flowchart that describes this process. First, in some embodiments, as shown in box 600, a conformal deposition of material, such as dielectric material is performed, thereby coating all surfaces of the three-dimensional structure. In some embodiment, the deposition may be only applied to some surfaces or may be applied in different amounts to the various surfaces. In other embodiments, a conformal deposition may not be performed.

It may be desirable that this deposited material be removed from some surfaces. In other embodiments, where a conformal deposition is not first performed, it may be desirable that one or more surfaces be etched. These surfaces are referred to as first surfaces. Similarly, it may desirable that the deposited material remain on some surfaces. In other embodiments, where a conformal deposition is not performed, it may be desirable that some surfaces not be affected by the etching process. These surfaces are referred to as the second surfaces.

In box 610, a first species of ions that can increase the etch rate of the material is implanted in one or more of the first surfaces. This first species of ions will allow the material on the first surfaces to etch more quickly than material that is not implanted with the first species of ions. In embodiments where a conformal deposition is not performed, this first species of ions may allow the first surfaces to be etched more quickly. It may be desirable to implant the first species of ions into all of the first surfaces, such as was done in FIG. 5C. In other embodiments, the first species of ions is only implanted into only a subset of these first surfaces, such as was done in FIG. 3B.

In box 620, a second species of ions that can decrease the etch rate of the material is implanted in one of more of the second surfaces. This second species of ions will allow the material on the second surfaces to etch more slowly on the second surfaces than material that is not implanted with the second species of ions. It may be desirable to implant the second species of ions into all of the second surfaces, such as was done in FIG. 4B. In other embodiments, the second species of ions is only implanted into only a subset of these second surfaces. Furthermore, in some embodiments, the second species of ions may also be implanted into one or more of the first surfaces. For example, top surfaces of a three-dimensional structure may be more susceptible to etching than vertical surfaces. Thus, to slow the etch rate of these top surfaces, it may be beneficial to implant the second species of ions to slow the etch rate. This may be in addition to the implantation of the first species of ions. Implanting both species of ions into some surfaces may also allow tuning of the etch rate of the different surfaces.

Note that it is not necessary to perform the process described in both box 610 and box 620. In some embodiments, only the process shown in box 610 is performed. In other embodiments, only the process shown in box 620 is performed. However, in all embodiments, an ion implant that alters the etch rate of the material disposed on at least one surface of the three-dimensional structure is performed.

After one or both of these processes are performed, the three-dimensional structure is subjected to an etch process, as shown in box 630. This may be an anisotropic etch, which preferentially etches in one direction. Alternatively, this may be an isotropic etch. In all embodiments, material is removed from the first surfaces, and remains on the second surfaces.

Figure 7:
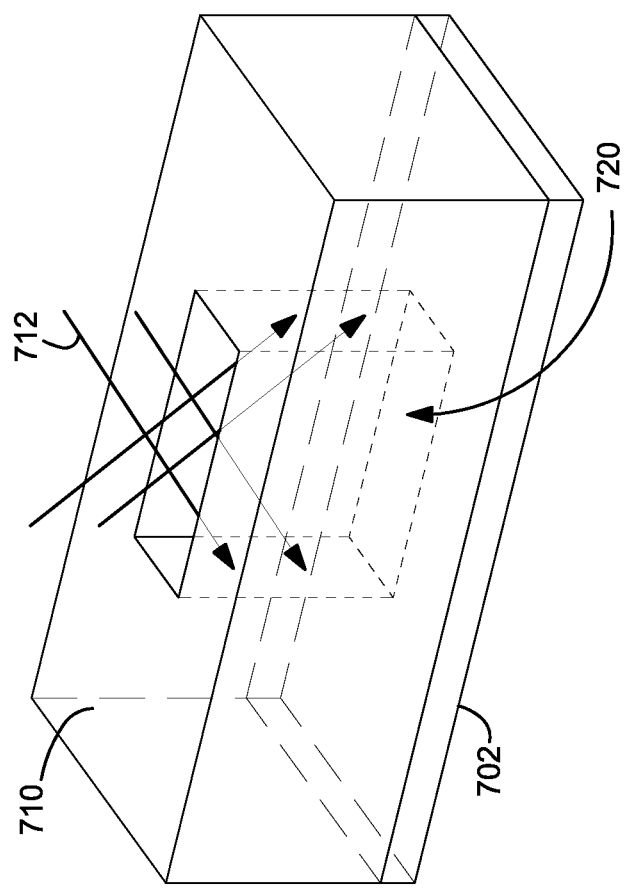
FIG. 7 shows an embodiment of a three-dimensional structure that may be treated in accordance with the method shown in FIG. 6.

FIG. 7 shows another example of a feature that can be treated by using ion implantation and etching. In this embodiment, a dielectric material 710 is disposed on a punch layer 702. The dielectric material 710 may be deposited or applied to the punch layer 702 so as to create a contact hole 720, which extends from the top surface to the punch layer 702. In other words, there may be no dielectric material is a region which extends from the punch layer 702 to the top surface.

It may be desirous to etch through the punch layer 702 at the bottom of the contact hole 720. However, it may also be preferable that the side walls of the contact hole 720 are not affected by this etching process. Thus, an implant of a species of ions 712, which decreases the etch rate of the dielectric material 710 is performed on the side walls of the contact hole 720. Following this implant of ions 712, an etching process, such as an anisotropic etch is performed. This etching process serves to remove material from the punch layer 702 at the bottom of the contact hole 720, while minimally affecting the sidewalls of the contact hole 720.

Thus, in this embodiment, a conformal deposition (such as that shown in box 600) may not necessarily precede the ion implantation steps (boxes 610 and 620).

Figure 8:
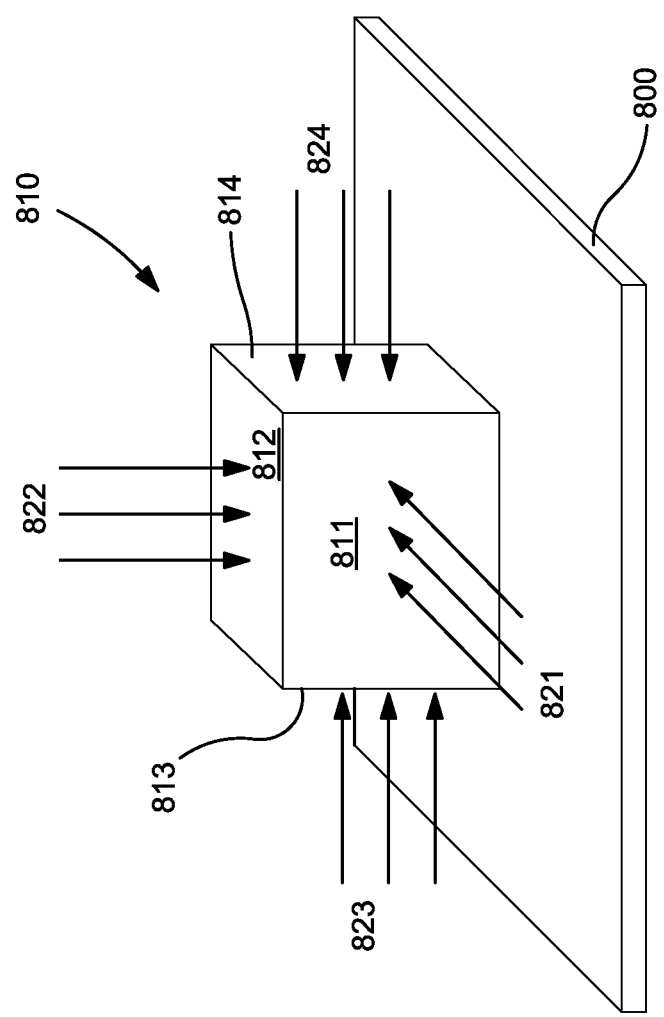
FIG. 8 shows an embodiment of a second three-dimensional structure that may be treated in accordance with the method shown in FIG. 6.

FIG. 8 shows another embodiment of a three-dimensional structure that can be treated in accordance with the flowchart of FIG. 6. In this embodiment, the three-dimensional structure 810 may be disposed on a substrate 800. The three-dimensional structure has a front surface 811, a top surface 812, two side surfaces 813, 814 and a back surface (not shown).

It may be desirable to have a dielectric material disposed on some of these surfaces. Thus, a conformal deposition may be performed on all surfaces of the three-dimensional structure 810. After the conformal deposition, ion implants may be performed on one or more surfaces to alter the etch rate of the dielectric material deposited on those surfaces. For example, a different ion implant may be performed on each surface. An ion implant 821 may be performed on the front surface 811. A different ion implant 822 may be performed on the top surface 812. Similarly, a different ion implant 823, 824 may be performed on the side surfaces 813, 814, respectively. An ion implant may also be performed on the back surface (not shown). Of course, some of these ion implants 821-824 may be the same implant.

As explained above, one or more of these ion implants 821-824 may comprise the first species of ions, which increase the etch rate. One or more of the ion implants 821-824 may comprise the second species of ions. Furthermore, the dose implanted into the surfaces 811-814 may vary to further alter the etch rates of the various surfaces. Thus, for example, an ion implant 821 using the second species may be performed on a front surface 811 to resist the etching of the dielectric material. A second ion implant 822 of the first species may be performed on a top surface 812 to encourage the etching of the dielectric material on that surface. A third ion implant 823 may be performed on a side surface 813 to encourage the etching of the dielectric material to a lesser extent than the top surface 812. As explained above, this may be done by performing two ion implants, using both the first species and the second species, to affect the etching rate. These two implants may be performed sequentially or simultaneously. In another embodiment, a single implant is performed using a different dose than that used in the second ion implant 822. Of course, the species of ions applied to each surface 811-814 may be different than the those used in the above example. Thus, by appropriate selection of the species and dose to be used for each ion implant 821-824, the etch rate of each surface of the three-dimensional structure 810 can be individually controlled.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming spacers on side surfaces of a gate on a finFET, where said finFET comprises a fin structure and said gate is disposed on said fin structure, comprising:
   depositing a dielectric material on said finFET, wherein said dielectric material covers a top surface and side surfaces of said gate and covers a top surface and side surfaces of said fin structure;
   implanting ions of a first species into said dielectric material disposed on said side surfaces of said fin structure, such that ions of the first species are not implanted into the dielectric material disposed on the top surface of said gate and the dielectric material disposed on the top surface of said fin structure, said first species increasing an etch rate of said material; and
   performing an anisotropic etching process on said finFET after said implanting, wherein said anisotropic etch preferentially removes dielectric material from the horizontal surfaces of said fin structure and said gate, so that said dielectric material is removed from said top surface of said gate and said top surface and side surfaces of said fin and remains on said side surfaces of said gate.

2. The method of claim 1, further comprising:
   applying a mask over said dielectric material disposed on said top surface of said fin structure, prior to said implanting process.

3. The method of claim 1, wherein said first species is selected from the group consisting of helium, hydrogen, fluorine, silicon, argon, carbon and oxygen.

4. A method of forming spacers on side surfaces of a gate on a finFET, where said finFET comprises a fin structure and said gate is disposed on said fin structure, comprising:
   depositing a dielectric material on said finFET, wherein said dielectric material covers a top surface and side surfaces of said gate and covers a top surface and side surfaces of said fin structure;
   implanting ions into said dielectric material disposed on said side surfaces and top surface of said gate and said dielectric material disposed on said top surface of said fin, said ions decreasing an etch rate of said material;
   performing an anisotropic etching process on said finFET after said implanting so that said dielectric material is removed from said top surface of said gate and said top surface and side surfaces of said fin and remains on said side surfaces of said gate.

5. The method of claim 4, wherein said ions are selected from the group consisting of carbon, phosphorus and boron.

6. The method of claim 4, further comprising:
   implanting ions of a different species into said dielectric material disposed on said side surfaces of said fin structure prior to said etching process, said different species increasing an etch rate of said material.

7. The method of claim 4, wherein said anisotropic etch preferentially removes dielectric material from the top surface of said fin structure and the top surface of said gate.

* * * * *